(12) United States Patent
Chen et al.

(10) Patent No.: US 6,483,751 B2
(45) Date of Patent: Nov. 19, 2002

(54) METHOD FOR MANUFACTURING NON-VOLATILE MEMORY CELL ARRAY

(75) Inventors: Kou-Su Chen, Fremont, CA (US); Shih-Chun Fu; Jui-Te Chan, both of Hsin-Chu (TW)

(73) Assignee: Amic Technology, Santa Clara, CA (US)

(*) Notice: Subject to any disclaimer, the term of this patent is extended or adjusted under 35 U.S.C. 154(b) by 0 days.

(21) Appl. No.: 09/840,840

(22) Filed: Apr. 24, 2001

(65) Prior Publication Data

US 2002/0031012 A1 Mar. 14, 2002

Related U.S. Application Data

(60) Continuation of application No. 09/598,826, filed on Jun. 21, 2000, now Pat. No. 6,249,459, which is a division of application No. 09/344,318, filed on Jun. 24, 1999, now Pat. No. 6,198,662.

(51) Int. Cl.[7] .................................................. G11C 16/04
(52) U.S. Cl. .............................. 365/185.26; 365/185.3; 365/185.33
(58) Field of Search ..................... 365/185.26, 185.23, 365/185.01, 185.04, 185.24, 185.3, 185.33, 185.29

(56) References Cited

U.S. PATENT DOCUMENTS

| | | | |
|---|---|---|---|
| 5,901,089 A | 5/1999 | Korsh et al. | 365/185.24 |
| 5,930,174 A | 7/1999 | Chen et al. | 365/185.29 |
| 5,953,255 A * | 9/1999 | Lee | 355/185.29 |

* cited by examiner

Primary Examiner—David Nelms
Assistant Examiner—Thong Le
(74) Attorney, Agent, or Firm—J. Nichols Gross

(57) ABSTRACT

A pre-erase/incremented erase mechanism is employed to reduce excessive tunnel oxide fields in flash memory cells. A variable conditioning signal removes charge from "fast" bits in the array, so that they are configured to have threshold voltages closer to an ideal initial state in preparation for an erase cycle. In this manner, the voltage thresholds are tightened and equalized, so that over-erasure problems associated with Fowler-Nordheim tunneling erase operations are substantially reduced, and endurance cycles for the array are maximized. The invention can be used in a device in the field, or as part of a design process for a flash memory cell to evaluate device performance.

20 Claims, 12 Drawing Sheets

| ERLVC | | <3> | <2> | <1> | <0> |
|---|---|---|---|---|---|
| ERLVC<0> | : -6.25V | 0 | 0 | 0 | 1 |
| ERLVC<1> | : -6.50V | 0 | 0 | 1 | 0 |
| ERLVC<2> | : -6.75V | 0 | 0 | 1 | 1 |
| ERLVC<3> | : -7.00V | 0 | 1 | 0 | 0 |
| ERLVC<4> | : -7.25V | 0 | 1 | 0 | 1 |
| ERLVC<5> | : -7.50V | 0 | 1 | 1 | 0 |
| ERLVC<6> | : -7.75V | 0 | 1 | 1 | 1 |
| ERLVC<7> | : -8.00V | 1 | 0 | 0 | 0 |
| ERLVC<8> | : -8.25V | 1 | 0 | 0 | 1 |
| ERLVC<9> | : -8.50V | 1 | 0 | 1 | 0 |

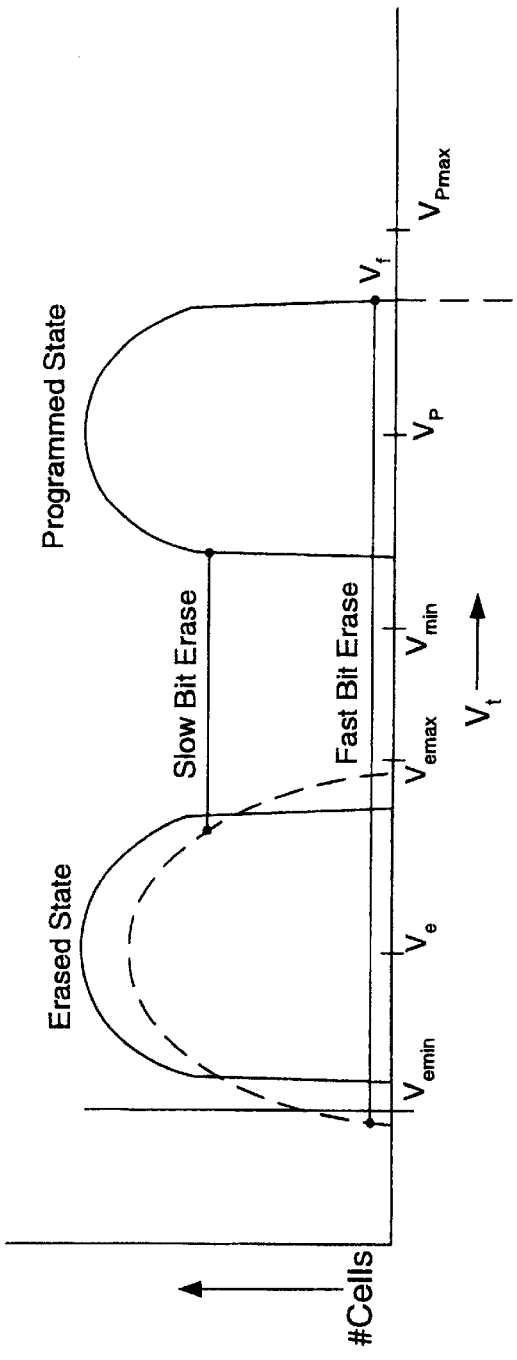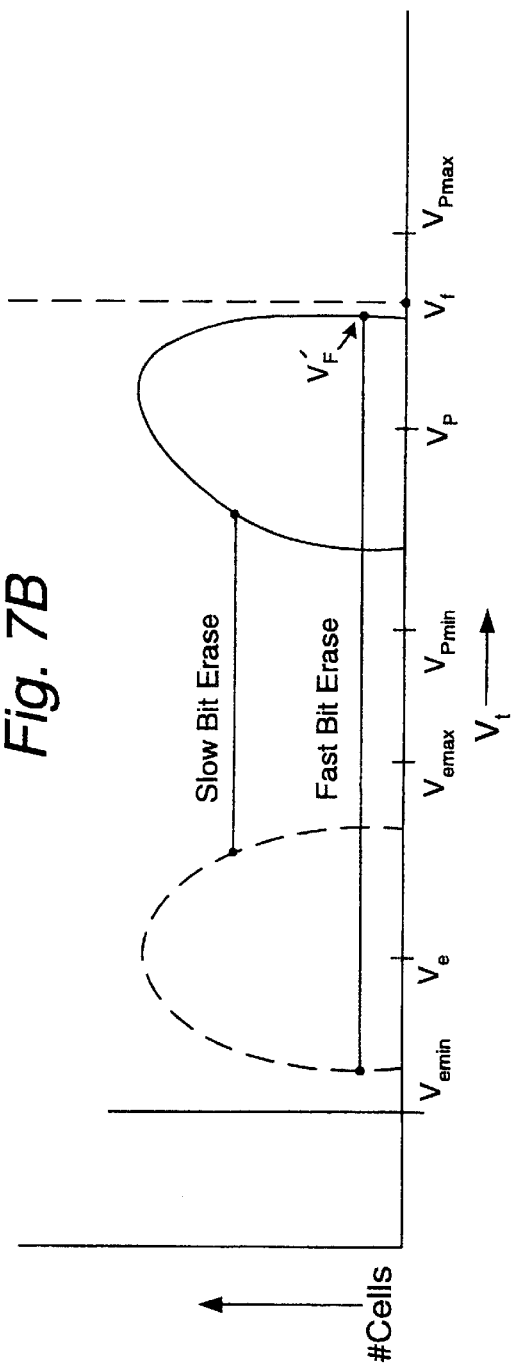

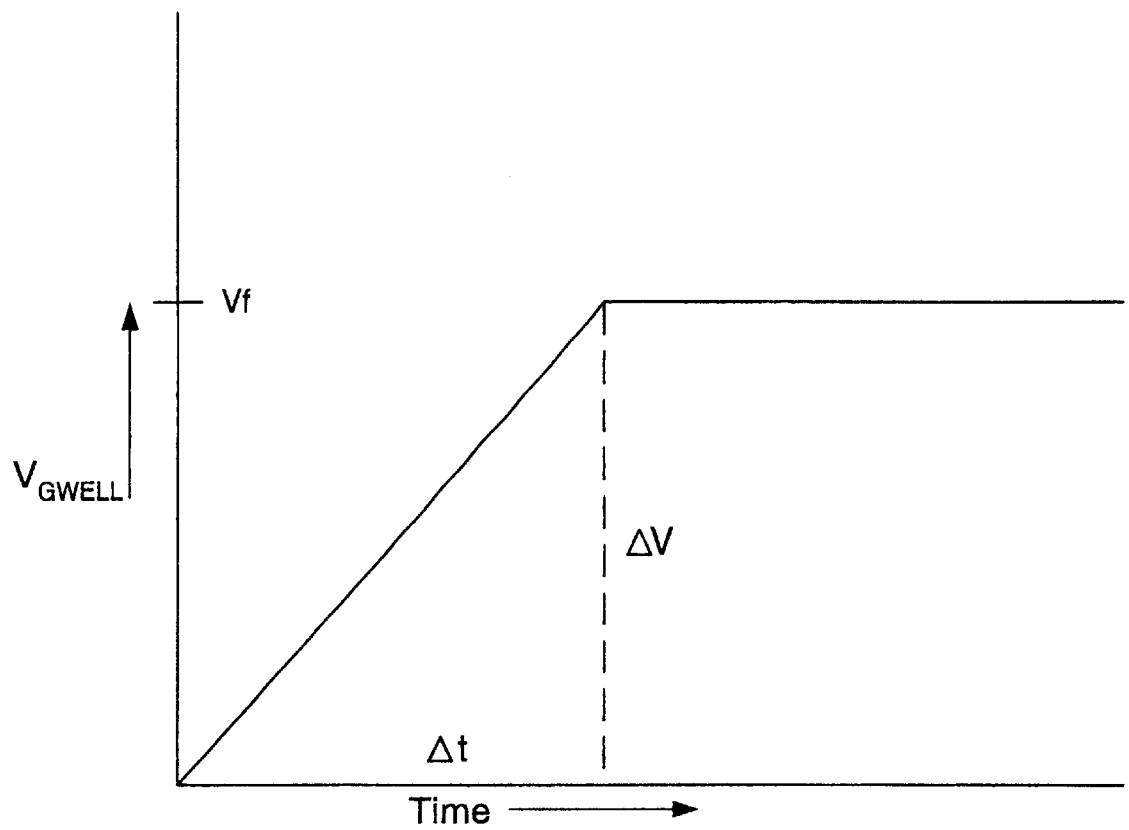

METHOD FOR MANUFACTURING NON-VOLATILE MEMORY CELL ARRAY

CROSS REFERENCE TO RELATED APPLICATIONS

The present application is a continuation of Ser. No. 09/598,826 filed Jun. 21, 2000, now U.S. Pat. No. 6,649,459 which is a divisional of Ser. No. 09/344,318 filed Jun. 24, 1999, now U.S. Pat. No. 6,198,662. Both of these disclosures are incorporated by reference herein.

FIELD OF THE INVENTION

The invention relates generally to a pre-erasing/erasing mechanism for flash EEPROM (Electrically Erasable and Programmable Read Only Memory) devices. The invention is particularly useful for flash arrays that utilize Negative Gate Channel Erase (NGCE) operations because it improves erase operations by reducing field intensity variations in tunnel oxides caused by processing deviations, increases the number of endurance cycles, and results in fewer over-erase errors.

BACKGROUND OF THE INVENTION

The endurance cycles of an EEPROM, especially the number of program and erase cycles, is the primary determinant of the life span of such device. Endurance cycles refer to the number of times which data can be reliably erased, re-programmed, and read back without errors. Accordingly, the number of endurance cycles dictates in large part the usable life of an EEPROM device. Consequently, one significant goal of prior art efforts is the maximization of such endurance cycles through the use of improved cell architectures which minimize cycle stress, as well as intelligent erase, program methods designed to be less stressful on the cell architecture.

Fowler-Nordheim (FN) tunneling is one of the most well-known, well-understood and prevalent techniques used in the art for erasing flash memory cells. A significant problem arises from the fact that certain cells (bits) in the memory array tend to be "fast" and others "slow" during an erase operation. In other words, because such cells tend to over-accumulate, or under-accumulate charge on their floating gates, or because charge becomes trapped in various locations, these cells tend to have threshold voltages that deviate significantly from a target threshold voltage. For this reason, when a "fast" cell is erased, it is much more likely to become over-erased. When a cell is over-erased during an erase operation, this causes additional administrative overhead, because it must be corrected if at all possible. This is undesirable, of course, because it slows down the operation of the device from being re-programmed with new data.

The existence of excess charge on the "fast" bits caused them to be over-erased for a couple of reasons. First, the FN erase mechanism depends strongly on the electrical field across the thin tunnel oxide layer in the flash cell; with more charge, the field is proportionately higher. This causes more charge to move off the floating gate during the erase operation. In other words, the fast bits have electrical field intensities that deviate significantly from desired target field strengths. Second, at the beginning of the FN erase, the floating gates are fully charged (i.e., in a programmed state) and the electrical field is a maximum. This means that the rate of erasure (the electrical discharge rate of the floating gate) is also highest at the onset of the FN erase operation. Thus, if fast bits are not corrected, they tend to become over-erased, and this leads to concomitant problems of excess leakage current and/or data errors. In the long run, these leaky bits cause failures, reduce endurance cycles, etc. As mentioned above, the problem is especially acute in (but not limited to) FN tunneling erase operations used with NGCE configurations. This is because the electrical field becomes extremely strong between the negative gate and the substrate well.

To date, there are very few practical solutions for dealing with this phenomenon, and no easy way known to applicants for compensating for electrical field intensity variations that occur in flash memory cell arrays. These field variations arise naturally both from wafer processing operations, which, by their nature, result in differences in cell structures, tunnel oxide characteristics (thickness and uniformity), etc., as well as from cycling of the device in normal operation. As the number of cells increase in EEPROM devices, and integration density increases, and cycling increases, the field variations also correspondingly increase because of the nature of normal distributions.

A related situation is addressed by U.S. Pat. No. 5,901,089, incorporated by reference herein. In this reference, the individual logic levels of a multi-bit cell are kept stable by ensuring that the threshold voltages of such cell are maintained within predefined threshold ranges. This is accomplished using what it refers to as "mini" erase/program operations, where a pulse is applied so that only enough charge is added or removed from a cell sufficient to keep it within a safe operating range for that state. While this approach is beneficial for improving sensing (read) operations, this technique does not appear to be very practical as a pre-erase conditioning operation. This is because it requires a significant amount of administrative overhead to perform this type of procedure on a cell by cell basis. Moreover, the reference is primarily directed ensuring that Vt overshoot is reduced for each programmed cell, and does not really address the issue of how to ensure that the behavior of cells collectively is relatively uniform and predictable during a subsequent operation in which they are to be transitioned from one logical level to another. In other words, there is no attempt made to treat one segment of the cell population (the "fast" cells) differently than another as may be necessary to achieve better operational results. Nor does this reference teach or suggest using a series of lesser strength erase signals to completely erase a programmed cell.

For these reasons, an effective method for dealing with so called fast bits is not known in the art, but is extremely desirable. Optimally, the erased set of cells has a relatively uniform distribution centered around a target erase value. To get this uniform distribution, however, it is necessary: (1) to place the cells in a similar state (initial floating gate voltage/ electrical field); and (2) for them to have similar electrical discharge characteristics. The first step can be accomplished by a conventional programming step, which, in theory, is intended to add sufficient charge to put all the cells into an initial target programmed voltage threshold state $V_p$. To date, nonetheless, applicants are unaware of specific and practical mechanisms for achieving the second step of controlling individual cell electrical discharge characteristics. To accomplish this goal, it is necessary to control the initial electric field at the tunneling oxide. If this electric field is not reduced at the onset of FN erasure for the fast bit segment of the array, the fast bits will be erased faster than average bits in the memory array. By the time the average bits are erased, the fast bits are already in a state of over-erasure. Correspondingly, if the electric field can be reduced at the beginning of the erasure for a particular bit, this will slow down the rate of erasure for the bit in question.

SUMMARY OF THE INVENTION

An object of the present invention, therefore, is to eliminate the problems generally inherent in the aforementioned FN tunneling erase operations when used with NGCE type EEPROM devices;

Another object of the present invention is to provide an improved circuit and method for erasing flash memory cells so that threshold voltage distributions of such cells are tightened both before and after an erase operation;

A further object of the present invention is to provide a circuit and method for pre-erasing flash memory cells with a conditioning signal to adjust and equalize their threshold voltage distributions prior to an erase operation;

A related object of the present invention is to provide a circuit and method for generating such conditioning signal, so that threshold voltage distributions can be finely controlled by a series of conditioning signals having predetermined magnitudes, durations, and similar signal characteristics;

Another object of the present invention is to provide that such conditioning signals can be custom tailored based on the particular processing implementation for such memory cell array, or, alternatively, that such signals can be determined in the field during normal operation of a flash EEPROM device;

Yet another object of the present invention is to control and equalize electrical field intensities across a tunneling oxide for flash memory cells in a memory array, and to compensate for normal manufacturing variations causing such field intensity deviations;

A related object of the present invention, is to reduce a discharge rate of fast bits in a flash memory cell to make such fast bits discharge at a rate comparable to a an average flash memory cell having a desired discharge rate;

Another related object of the present invention is to reduce the probability of a fast bit from becoming over-erased, by conditioning such bit to have an electrical field comparable to that of an average flash memory cell prior to an erase operation, so that such fast bit behaves essentially like an average memory cell during such erase operation, and is therefore not over-erased by a fill strength erase pulse; and Another object of the present invention is to identify fast bits in a flash memory array and provide them with conditioning signals which modify erase behavior of such fast bits but not erase characteristics of average or slow bits in such array;

A related object of the present invention is to provide an erase mechanism that uses a stepped or graduated reduction of charge for cells in a flash memory, so that erase cycles and resulting erased voltage distributions are more accurately controlled;

Yet a further related object is to reduce cell leakage current by eliminating the occurrences of over-erased fast memory bits in a flash memory array;

Still another object of the present invention is to provide a memory cell array capable of longer life span, by increasing the number of endurance cycles;

An additional object of the present invention is to reduce the possibility of malfunctions and errors in flash memory cells caused by excessive numbers of leaky data bits.

Yet still another objective of the present invention is to provide a complete integrated circuit that implements the aforementioned methods.

Another objective of the present invention is to provide an improved erase circuit for accomplishing both the regular full strength Negative Gate Channel Erase and pre-erase operations described above, using the same charge pump.

A further object of the present invention is to provide a programmed logic controller for achieving step-by-step time sequencing of varying intensity conditioning signals to effectively reduce the electrical field across the tunneling oxide at the initial phase of erasure in order to control/equalize the discharge rate of fast bits in Flash memory array.

These objectives and other significant advantages are provided by the novel methods and circuits disclosed herein. A method of slowing down erase speeds of "fast" discharge flash cells in a memory array—where the fast discharge flash cells are generally characterized by erase speeds substantially faster than target erase speeds for flash cells in the array—generally includes the following steps: (a) generating a conditioning signal to remove a quantity of charge from the flash cells, which quantity of charge is related to an erase speed of the flash cell, but is insufficient to place such flash cells into an erased state; and (b) applying such conditioning signal to such flash cells while the cells are in a non-erased state. The conditioning signal is preferably applied on a global basis to the control gate while the source and drain regions are kept floating. In this fashion, the floating gate charge value is adjusted by the conditioning signal by a charge amount proportional to the original electrical field intensity. In other words, the faster cells will experience the greatest change in charge reduction. From a physical perspective, therefore, the present invention operates to substantially equalize electrical field intensities across tunnel oxides associated with each of the floating gates of the flash memory cells.

After the conditional signals treat such array, the erase speed of such fast discharge flash cells is significantly reduced. Since the other non-fast cells are left relatively unaffected, the entire distribution of erase speeds (and threshold voltages) in the cell array is equalized, so that the array can be treated with greater reliability and predictability in subsequent array operations (such as an erase operation).

Prior to performing the above conditioning, of course, a conventional programming operation can take place, followed by an additional threshold voltage measuring step. The latter measures the electrical characteristics of the flash cells to determine an expected erase discharge speed for such flash cells, and to determine which ones, if any, may need pre-erase conditioning.

During the conditioning cycle, the above steps are repeated as necessary to remove further charge from the flash cells. For each iteration, the properties of the conditioning signal, including magnitude and/or duration, can be varied to remove more or less charge from the flash cells. Usually, the cycle is set up so that each successive conditioning signal removes a greater quantity of charge.

After the array is pre-conditioned, a normal, full strength erase operation can be performed. Because the cell discharge characteristics are modified immediately in advance of the erase operation, the result is that there are fewer fast bits, and those that do exist have been slowed down to the point where it is less likely they will become over-erased.

In another embodiment of the invention, instead of a full strength erase cycle, the aforementioned conditioning cycle is instead repeated as necessary to fully erase the cells. This approach provides finer, more accurate control of the erase operation, and helps to ensure that, as the cell array characteristics change with time, the erase is performed in a manner that is tailored to such characteristics.

Thereafter, an over-erase detection operation takes place, to verify that no cells have been over-erased from said erase operation. In the event any such cells are detected, a two-stage convergence operation is preferably performed. This includes generally two independent sequential operations, including (a) a global operation performed on the entire array; and (b) a localized operation performed only on those cells still over-erased after the global operation is completed.

In another variation of the invention, it is possible, for example, to practice the present methods in the context of a pre-program conditioning operation, so that the cell charge acquisition (instead of discharge) characteristics are modified instead. The only important consideration is that the flash cell floating gate charge values are made to substantially converge to an initial target charge value so that all of the flash cells can then be erased/programmed at an approximately uniform rate by a subsequent operation.

Another beneficial aspect of the present invention lies in the fact that characteristics of the conditioning signal can be adjusted during a manufacturing operation, so that it will be specifically tailored for the manufacturing deviations present in an associated memory array.

A novel method of erasing flash memory cells in a flash memory cell array, therefore, utilizes the aforementioned pre-erase operation in conjunction with a traditional erase operation. Again, unlike a conventional erase operation, however, the present invention can "fix" potentially problem cells individually for maximum control/flexibility of an erase operation. Thus, non-uniformities in electrical field intensities across tunnel oxides for flash cell in such array, caused by unpredictable but inevitable manufacturing process variations, can be substantially reduced. This results in increased product endurance, less erase time, better yields, etc.

A flash memory integrated circuit can be constructed using conventional wafer processing steps to include the teachings of the present invention. In such circuit, an array of flash memory cells is provided, each of such cells having a conduction threshold voltage, a control gate, a floating gate, a source and a drain. A logic controller circuit is coupled to the array for adjusting the threshold voltages of the cells prior to an erase operation, and is configured such that it can generate control signals in accordance with the methods described, and so that appropriate signal generating circuits can apply the aforementioned conditioning signals in the manner described above as well.

A preferred embodiment of a pre-conditioning control circuit of the present invention effectuates the above processes by the operation of: a pre-erase signal generator for generating a flash cell pre-erase signal to be applied to the flash cells; and a pre-erase signal magnitude control circuit for generating a plurality of control signals, which control signals determine a magnitude for the pre-erase signal; a pre-erase voltage supply circuit for generating a number of necessary supply voltages, including a negative voltage source in the case of a pre-erase signal; a pre-erase voltage supply switching circuit for generating a pre-erase voltage supply signal that is based on the negative voltage source; and a pre-erase voltage supply switching control circuit, which is configured to control gating of the pre-erase voltage supply switching circuit with a stepping signal. The pre-conditioning control circuit thus generates the pre-erase voltage supply signal as a function of the plurality of control signals and in a time sequence determined by the pre-erase signal magnitude control circuit. This flash cell pre-erase signal is configured, as noted earlier, to remove a quantity of charge from the flash cells in preparation for an erase operation, which quantity of charge is related to an initial erase speed of the flash cell and further being insufficient to place such flash cells into a fully erased state.

Another useful aspect of the inventive pre-conditioning control circuit includes the fact that the pre-erase signal generator includes a plurality of FETs connected in parallel, and that are activated by the plurality of control signals according to a controllable sequence so that the desired magnitude and duration of the pre-erase signal is well controlled.

As noted earlier, the control signals are varied during the time sequence so that the magnitude of said pre-erase signal is varied during said defined time sequence. In the typical case, it is increased from step to step to affect the cells more—i.e., to remove more and more charge during each step. Again in a preferred embodiment, a pre-erase signal is first pre-charged to a target reference voltage level before the plurality of control signals are applied, to increase speed and reliability.

To control the pre-erase voltage supply switching control circuit, a plurality of pulse generator circuits, one for each of the plurality of control signals, generate a pulsed version of such control signals that is applied and used to generate the aforementioned stepping signal.

The aforementioned pre-conditioning circuit therefore, operates as an equalizing circuit that equalizes the erase rates of the flash cells, and thus makes it more likely that they will not be over-erased, requiring additional system overhead, loss of data from faulty bits, etc.

As alluded to earlier, the operational characteristics of the pulse generator circuits can be adjusted during a manufacturing operation, to tailor such operational characteristics to the pre-erase signal requirements of cells in a flash memory array associated with the control circuit.

Thus, a system for erasing flash memory cells in the present invention includes programmed logic within a flash controller circuit (usually a state machine), so that erase control logic includes two logical components, including: (1) a pre-erase controller circuit controlling a flash cell pre-erase operation, managing the conditioning signal magnitude, timing and sequencing, as well as (2) a conventional erase controller circuit for controlling a normal strength flash cell erase signal.

The present invention, therefore, is extremely useful in those environments that rely on FN tunneling, and helps to eliminate potential problems caused by normal process variations in tunnel oxide layers, floating gates, cell topographies, etc.

BRIEF DESCRIPTION OF THE DRAWINGS

FIG. 7A is a graphical illustration of the effect of a prior art erase operation on the threshold voltage of a slow flash cell and a fast flash cell in a memory cell array.

FIG. 7B is a graphical illustration of the effect of the pre-erase operation of the present invention on a threshold voltage for fast flash cells in a memory array.

FIG. 8A illustrates a timing diagram of a voltage level as it is generated by the well bias voltage circuit and applied to various well areas of a flash memory array.

DESCRIPTION OF THE INVENTION

Figure 1:
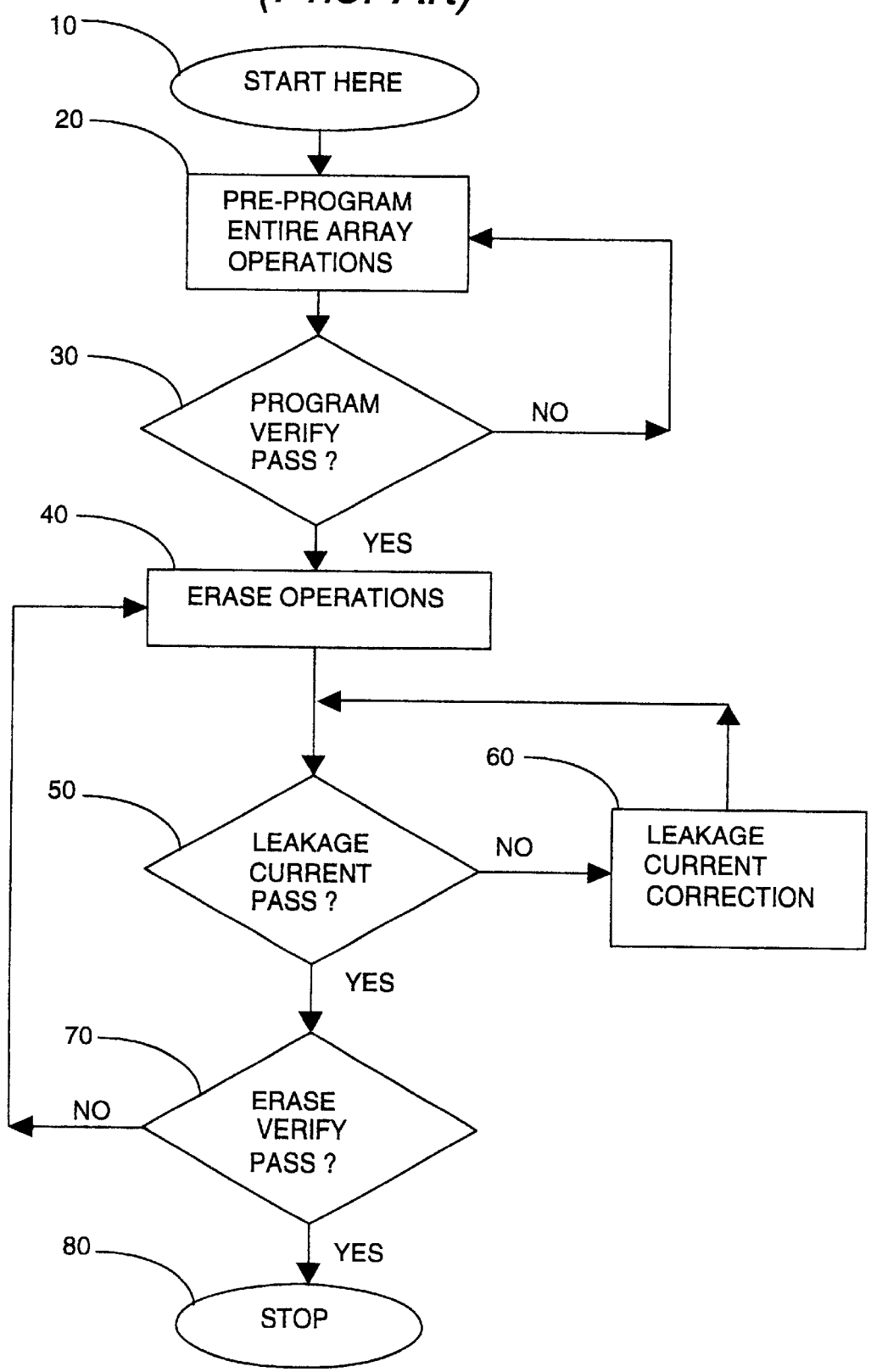
FIG. 1 is a simplified flow chart showing steps used in a conventional prior art non-volatile Flash memory erase operation.

A detailed explanation of the preferred embodiments is now provided, examples of which are illustrated in the drawings and discussed herein.

In a conventional non-volatile Flash EEPROM array, data in the memory array may be erased electrically all together as a block while new data can be programmed after on a byte-by-byte basis. Although the erasure is normally effected on all memory cells in the array simultaneously, not every cell in the same array will be erased equally fast, or to the same erased voltage state as mentioned above. Some bits will be relatively fast, and some bits will be relatively slow. This is due primarily to normal variations in the processing technology as well as the topological deviations associated with the control circuits, which tend to affect the tunneling oxide characteristics, the floating gate characteristics, etc. In addition, normal "aging" of a cell from repeated cycling will also cause it have varying and unpredictable behavior due to charge trapping, structural deterioration, and the like. These factors are unavoidable in conventional memory arrays, and are becoming increasingly more difficult to cope with as such memory arrays increase in density, size, etc. Thus, owing to the reasons cited above, controlling the erase operation in a Flash memory array to achieve uniform memory cell characteristics after electrical erase is becoming substantially more critical than the program operation.

A conventional method of erasing a Flash memory array is illustrated in FIG. 1. As is known, the memory array is first pre-programmed at step 20 to set all cells to a known data value before the erase operation. After confirming at step 30 that all cells have passed the program verification, the procedure then proceeds to erase the cells at step 40 using any conventional method, such as a standard erase pulse of suitable magnitude and duration applied repeatedly to the entire array. The execution of an erase operation involves typical logic control circuits such as a counter, timer, pulse generator logic controller and so forth, which are well-known in the art. An example of these circuits can be seen in our pending application Ser. No. 08/988,872 which is incorporated herein by reference. At step 50, a check is made for over erased bits; these bits are undesirable for a number of well-known reasons, including the fact that they tend to cause current leakage in the memory array. If over erased bits are detected by the control circuits, step 60 then tries to perform a correction routine to reduce the leakage current. One exemplary method for performing such routine is described in detail in the aforementioned pending application. This correction procedure is repeated until all bits can pass the leakage current test, or until there is a determination made that the part has failed due to uncorrectable current leakage in the Flash memory array.

As soon as step 50 and step 60 are finished, step 70 executes an erase verification routine to ensure all the memory cells in the Flash memory array are completely erased. If any cell in the memory array is not yet erased completely, the control circuits starts the entire procedure over again as illustrated in the flow chart of FIG. 1. If for any reason, however, the memory array can not pass any step as shown in the flow chart, the Flash memory array is considered defective, and thus the endurance cycles are compromised to a much lower limit. It is plain also to see that the existence of over-erased cells significantly slows down the operation of the device, since routine 60 must be executed to see if such cells can be corrected. Furthermore, the correction routine 60 and erase operations 40 impose additional stresses on the cells by way of additional conditioning signals/pulses, and this also undesirably shortens the life span of such cells.

Clearly, therefore, it is extremely beneficial to reduce the need and invocation of such routines; applicant believes that the present inventions accomplish this goal by taking intelligent precautions to reduce the probability that any cells will become over-erased in the first place. This is done primarily by a strategy that focuses on those cells that are identified as susceptible or pre-disposed for erratic discharge behavior, and in particular, so-called "fast" bits which are most likely to cause such problems.

Figure 2:
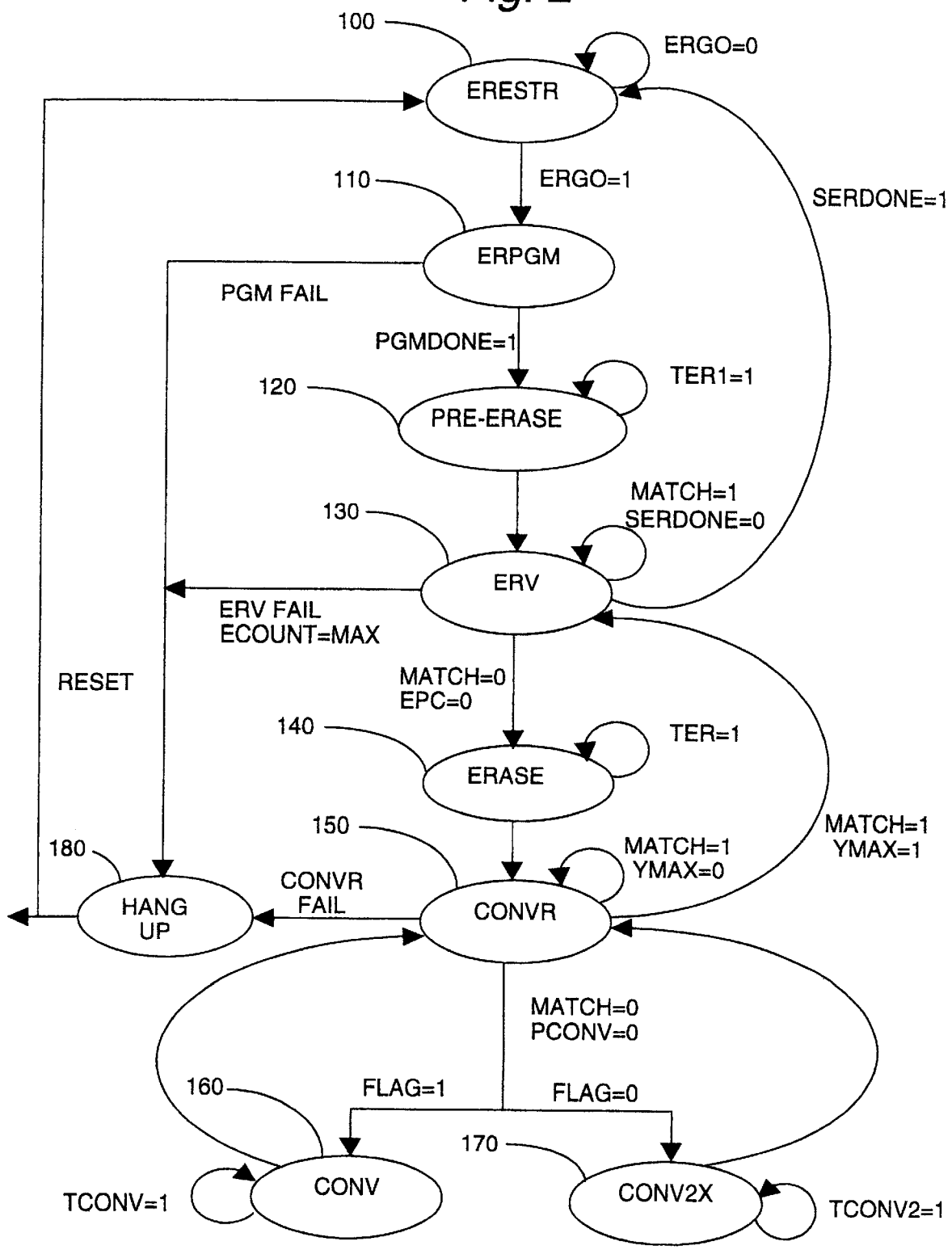
FIG. 2 is a flow chart showing the steps practiced by a flash memory logic controller circuit of the present invention, including a pre-erase operation performed prior to a full erase.

FIG. 2 illustrates an embodiment of a preferred erase method of the present invention, which, in contrast, to the prior art includes a pre-erase procedure as well. This new erase and pre-erase method is now explained briefly. Generally speaking, the primary task of the pre-erase procedure is to correct (as best as practically possible) the fast bits in the non-volatile Flash memory array, by reducing an electrical field associated with a tunneling oxide for such bit. From a simplified perspective, and with all other things being equal, as the electrical field across the tunneling oxide becomes greater, so does the rate of charge accumulation or discharge for the floating gate of the cell. Accordingly, if in advance of an erase operation this tunnel oxide field can be reduced for those cells having relatively high initial starting field values, such cells can be effectively slowed down and made to behave more like a target cell during the actual erase operation. Furthermore, if this electrical field treatment can be controlled with reasonable precision, the pre-erase procedure can be confined and limited to affect only those cells that are the most likely to cause a problem during the erase operation. Thus the present method has little or no adverse effect on any cells having normal or slow behavior during an erase operation.

Figure 2B:
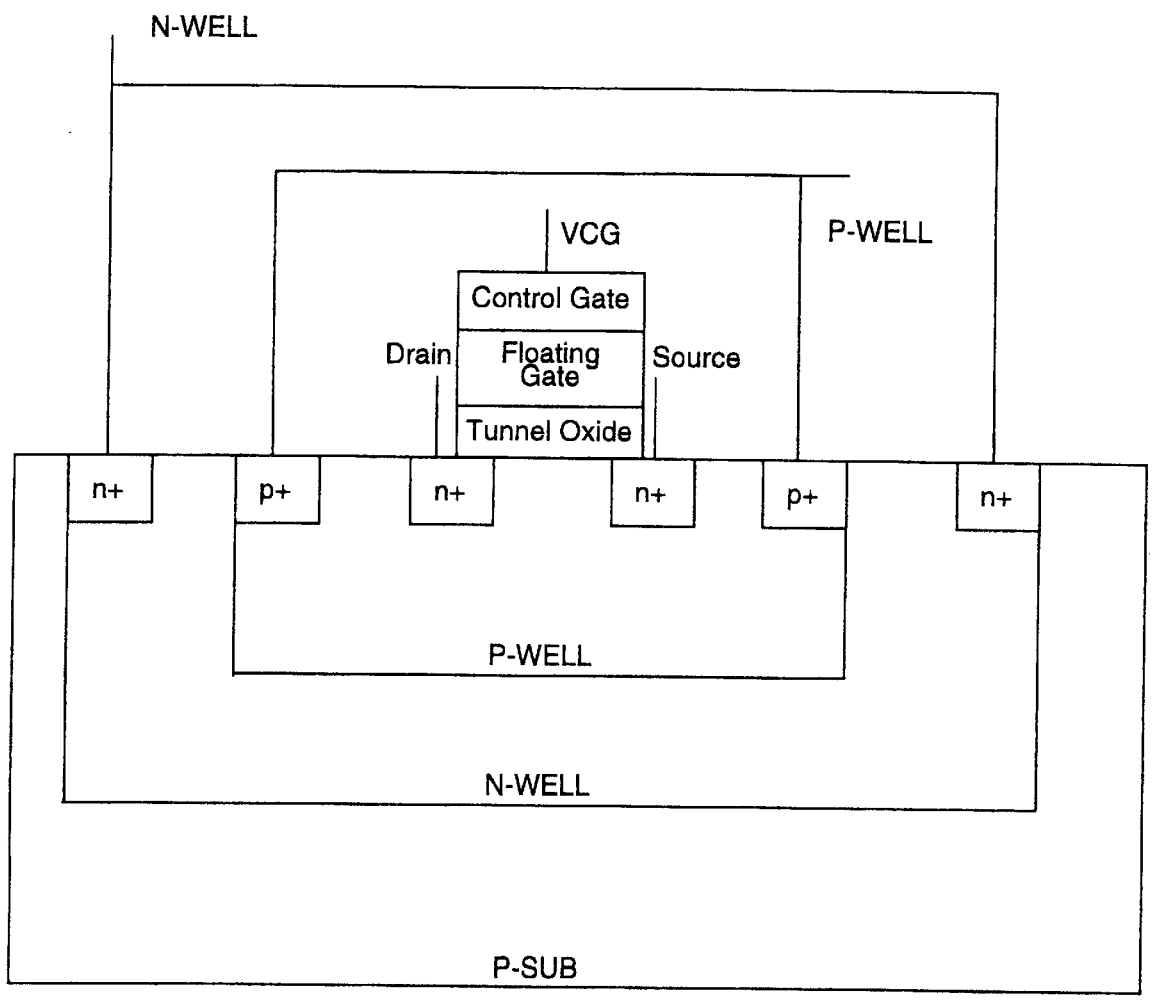
FIG. 2B is a cross sectional view of a non-volatile Flash memory cell structure used in the present invention, which cells are situated in a P-WELL enclosed by a deep N-WELL.

The effect of the pre-erase treatment can be summarized as follows:

the electrical field across the tunneling oxide is reduced by an amount proportional to an initial value for such field; in other words, those cells having the greatest positive deviation from a target field value (i.e., those having the greatest potential for over-erasure) are affected the most;

this means that the erase speeds of these fast discharge flash cells are reduced to be more like those of target flash cells, so that for a given erase pulse magnitude and duration, such fast cells do not lose as much charge as they would before without pre-erase treatment;

the corollary of this is that the overall erase speed of cells in the memory array is "equalized" in the sense that the fast bits are made to conform to look like the rest of the cell population;

because the overall cell population discharge rate is slowed down, and the fast cells are not as fast, they do not lose so much charge that they become over-erased;

the reduction in probability of a cell becoming over-erased results in fewer over-erased cells in fact, which in turn means that fewer additional corrective routines and erase routines are executed, and which further means increased endurance and life-span for the device because of the reduction in cycle stressing;

with the pre-erase cell population more uniformly distributed, the erase operation has more predictable and consistent effect, and the resulting erased population also has better threshold voltage distributions;

with a more predictable erased threshold voltage distribution for the cells in the memory array, later operations, including programming, are also more reliable;

undesirable processing variations in the tunneling oxide, cell array topographies, etc. that would otherwise cause premature failures can be compensated for (to a large extent) in a manner that is inexpensive, flexible, and easy to implement The routine of FIG. 2 is preferably executed as a control routine by a logic controller coupled to the flash memory array (see FIG. 2B). As seen at step 100, this routine starts by verifying that a command is present for initiating an erase operation. If the commands are correct, then an internal state machine of the logic controller sets a variable ERGO=1 valid. The logic controller circuit and state machine can be constructed in any number of known ways, and the specifics of the same are not material to the present invention. This is true, as well, with other hardware aspects of the present invention with the exception of the voltage generators (FIG. 3), pulse generators and control logic (FIGS. 4–6) for which preferred circuit implementations are specifically provided for herein.

Referring again to FIG. 2, after the initial erase command verification step, a conventional pre-programming before erasure step takes place at 110; the intent of this step is to move the threshold voltages of the cells to a known state prior to the erase operation, and to reduce over-erase problems. Thus, at this stage, the cells are all in a programmed state, which can also be considered a non-erased state; i.e., the threshold voltage $V_t=V_p$, where $V_p$ is a target programmed state value. Ideally the cells will have the same initial floating gate charge, and the same threshold voltage value at this point, but, for the reasons mentioned above, this is not the case in reality. If the pre-program fails, the routine routes to step 180 for hang-up which means the memory array is defective, which may be caused by a number of reasons.

At step 120, if all the programming procedures are completed, instead of beginning a conventional erase operation, the pre-erase procedure of the present invention is executed. During this pre-erase procedure, a series of conditioning signals (pulses) are applied to the cells in the memory array. These signals are configured to remove a quantity of charge from the floating gates of the cells, which charge quantity is enough to reduce the tunnel oxide field, but not enough to put the cell into an erased state. As seen in FIG. 2B, the pre-erase conditioning signals are applied to a control gate VCG while the source and drain are left floating. A positive potential is asserted at both the p-well and n-well regions while the p-substrate is grounded.

In practical terms, this step can be considered a "partial" erase, since some charge is removed from the floating gates of the cells, but not enough to constitute a full strength erase. Unlike a full strength erase, the conditioning signals in this case are only applied for short periods of time, for a limited number of cycles, and can be smaller in magnitude as well. Broadly speaking, the preferred approach begins with a conditioning signal that causes a relatively low electrical counter-acting field to be generated across the tunneling oxide to remove charge from the floating gates, and this counter-acting field is gradually increased in subsequent conditioning signals to some maximum value. Notably, when these conditioning signals are applied to the cells, the cells with the highest initial fields will also experience a greater loss of charge, which means they will be affected the most. This beneficial side effect of the present invention means that relatively slow bits, and even normal bits, will be only slightly (if at all) affected by the pre-erase procedure. As mentioned also above, in the end, the fast bits will be modified to have smaller electrical fields, and this in turn results in their behavior being changed to act more like an ideal, target cell in the array.

Thus, after the pre-erase treatment, the cells will now have a more uniform, equalized field intensity and correspondingly a more uniform and equalized erase rate. The cells in the array can be monitored, after the end of each particular conditioning signal (or some predetermined sequence) to examine the effects of the treatment to that point. In other words, the existence, degree, and characteristics of any remaining fast bits can be determined, by examining the threshold voltage distributions. If necessary, an additional conditioning signal (or sequence) can be applied, followed by a subsequent monitoring step, etc. Thus, a fast, iterative process can be employed by repeating the above steps to force the cell population to have a set of threshold values below a target threshold value, and without concern for placing such cells accidentally into an erased state, or the possibility of substantially affecting normal cells. The particular sequencing, magnitude, duration, and number of cycles of the conditioning signals will, of course, vary from array to array depending on the characteristics and number of fast bits, but can be optimized as necessary and/or desired within the logic controller circuit. A particular preferred approach used in the present invention is depicted in FIG. 4D, and is discussed in more detail further below.

As soon as the step 120 for pre-erase has completed as illustrated in FIG. 2, erase verification at step 130 commences to check if all the memory cells have been completely erased. While no cells are intended to be fully erased prior to this time, this step is common practice, and typical of erase procedures known in the art. If any bit in the memory array does not pass erase verification (as would be expected to be true at this stage), then fill strength of erasure at step 140 begins. This erase operation uses a conventional full strength erase pulse with a magnitude, duration, and frequency adapted in known fashion for the memory array in question. At the end of this operation, all the memory cells should be in an erased state, and, because of the effect of the pre-erase operations noted above, with reduced numbers of over-erased cells.

After each erase operation, cell leakage for each column will be checked as illustrated at step 150 to ensure that no memory cell has been over-erased in the memory array. If all the cells are erased, with no over-erasures, then the erase procedure terminates.

However, if current leakage in the memory array is detected, then the routine transitions to a convergence sub-routine comprised of global convergence step 170 and column threshold convergence step 160. A preferred embodiment of this convergence sub-routine is described in applicant's pending Ser. No. 08/988,872. Briefly, when an over-erase condition is found for any bit, a FLAG=0 condition exists, so a global convergence cycle 170 utilizes a series of "soft" program and soft erase conditioning pulses to adjust the flash cell threshold voltages in the array on a global basis. This procedure is executed for a configurable, pre-determined length of time for efficiency and effectiveness based on parameters of the array that can be programmable and/or determined optimally in advance by a variety of test and modelling measurements. The soft program and soft erase pulses are also tailored specifically for the array in question, and are not of the same type as a full strength program and erase pulse respectively. The effect of step 170 is to gently pull and tug the edges of the cell threshold voltages, resulting in a tighter distribution. This is because cells having relatively high deviations from the target erase voltage are affected the most by these soft program/erase pulses. While the details of the global convergence are not material to the present invention, more information on the same can be found in the aforementioned pending disclosure.

After the global convergence cycle step 170, cell leakage current is checked again at step 150. If step 170 has been completed and excessive leakage current is still detected in the memory array, FLAG is set to 1, and a column threshold convergence cycle 160 is executed to provide even tighter control of cell threshold distribution in the Flash memory array. This step is more effective than the global convergence cycle at eliminating single bit over-erase errors, because it is applied on an individual column basis. More particularly, this cycle uses a series of adjustable but well targeted soft program pulses to nudge a particular cell out of the over-erased state, and into an acceptable area corresponding to a threshold value for a target erase state. The duration of the cycle, as well as the number of soft program pulses, can be customized for specific applications.

In the applicant's experience, the combination of these two cycles substantially reduces the existence of over-erased cells, should any exist after the erase operation noted above. This combination is optimal because the global convergence cycle works very quickly on a rough scale to eliminates a large portion of leaky cells; the remaining small number of leaky cells are eliminated on an individual basis by the column threshold cycle, which, albeit slower overall, should not slow down the operation of the device since it should not have many errors to fix.

After step 160 is finished, verification for the completion of erasure at step 130 is repeated to ensure that no memory cells were disturbed by the convergence cycles at steps 160 and 170. The entire sequence of steps beginning at step 130 can be repeated for a pre-determined number of times, based on a programmable parameter ECOUNT, until the memory array passes erase verification, or until such parameter maxes out ECOUNT=Max), which results in a hang-up at step 180.

In another variation of the above embodiment, the array conditioning process is not discontinued prior to an erase operation. Instead the conditioning process is extended in time so that the cells in the array are actually finally fully erased, as they would be from a conventional fill scale erase pulse. In this fashion, the array is erased in an incremented, controlled approach, with more and more charge gradually removed from the cells. This is done as follows: during the pre-erase conditioning process described above, the conditioning signal is stepped (incremented) in magnitude after a predetermined number of cycles (e.g., 8). For the entire pre-erase cycle, the signal magnitude can be varied from approximately −6.50 to −8.50 volts, with 0.25 volt increments; however, it is possible that it may be terminated prior to that time, if the measured threshold voltage distributions suggests that it is not necessary to continue (i.e., the fast cells have been slowed down sufficiently). At this point, in lieu of performing a conventional erase cycle, with a large number of iterations of a full scale signal, the present embodiment continues the pre-erase cycle past the normal stopping point, and uses this process instead to proceed to fully erase the array. Thus, instead of breaking up the erase operation into two distinct phases (i.e., pre-erase and full erase) having different signal characteristics (as noted earlier), the incremented erase cycle of this variant of the present invention is actually comprised of a single type of erase operation in which repeated small intensity signals are used to gradually reduce the floating gate charge, and, correspondingly, the threshold voltages of the cells. In this approach, after stepping through the various signal levels for each invocation of the process in 0.25 volt increments, a final high intensity voltage level is reached (−8.50 volts in a preferred embodiment) for the pre-erase phase. For the "erase" phase, this voltage is kept constant, and there is no longer any stepping of the conditioning/erase signal voltage. This is because the lower intensity signals will no longer be effective to move charge away from the floating gates anyway. Unlike a full erase operation, however, the incremented erase of the present embodiment uses a much smaller number of pulses (for example, 6–10 applications instead of hundreds for a normal erase) to only adjust the cell thresholds by a much smaller degree. After each 6–8 pulse iteration, the cell array is checked to see if it is yet fully erased. If not, another 6–10 pulses are applied, and the procedure is repeated as necessary. Other variations are of course possible, and may be more optimal in some environments. For instance, it may be preferable to use a scaled number of pulses with each iteration, so that N are used for the first iteration, N/2 for the second, N/3 for the third, etc., etc. This allows an erase procedure to be self-adjusting to the behavior of the cells in the array, because, over time, their erase characteristics will change, and it is difficult to predict and fix in advance a constant erase parameter that will satisfy all operating conditions of the array. During this incremented erase process the number of erase pulses, therefore, will vary and be dynamically adjusted in accordance with the requirements of the array.

Notably, the present method can be used with a device in the field, or, alternatively, as a design/test tool aid in connection with monitoring the quality of a non-volatile cell or array architecture. Examples of particular preferred embodiments for generating the pre-erase signals, and associated supporting signals (negative erase supply voltages, control signals, etc.) are illustrated in FIGS. 3 to 6.

Figure 3:
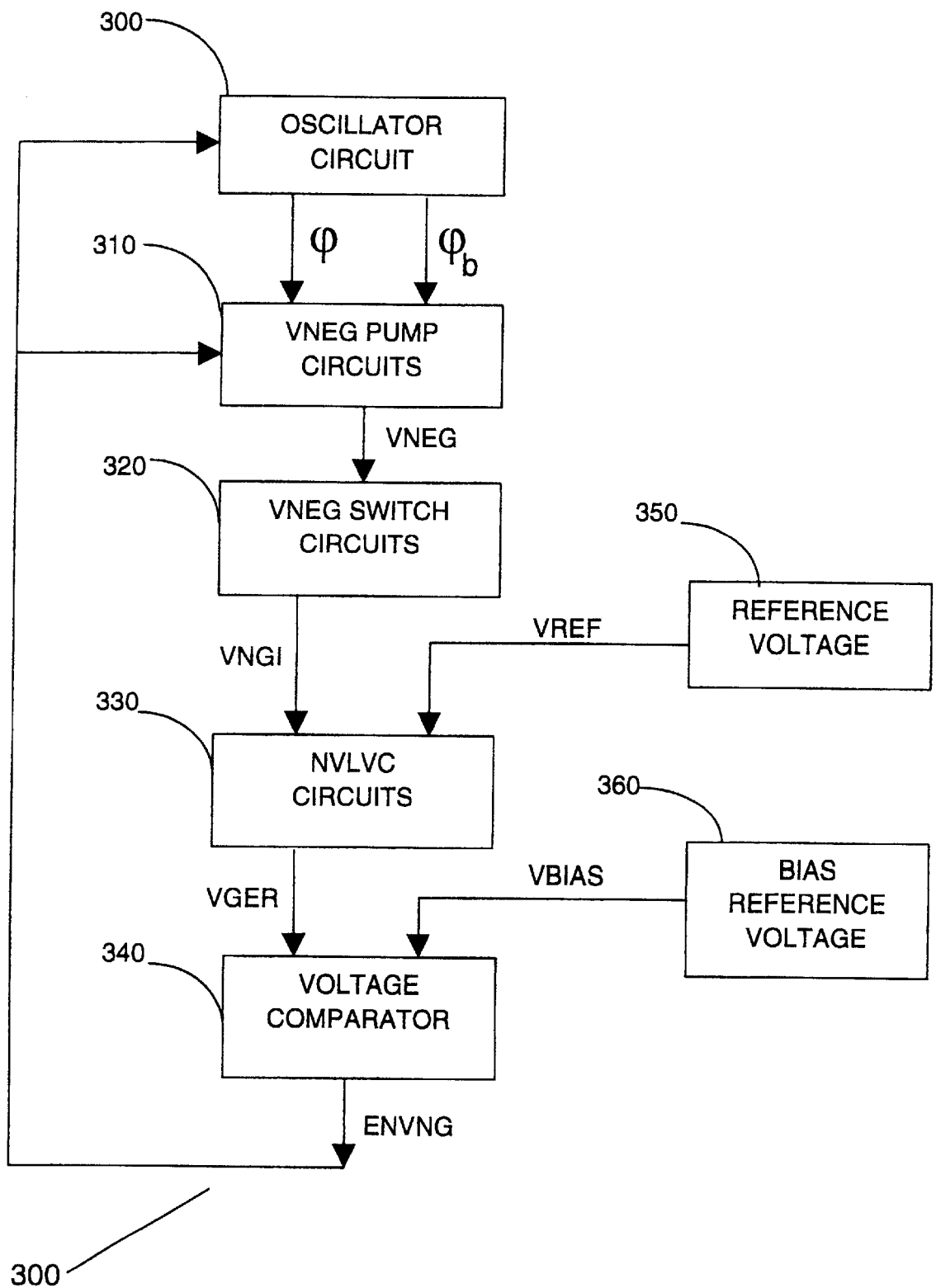
FIG. 3 depicts in block diagram format the voltage generators and signal generators used for performing the pre-erase and modified erase operation of the present invention.

In FIG. 3, a block diagram is provided showing the circuit components used with a pre-erase/incremented erase circuit 300 to generate the necessary voltages, clocks, control and pre-erase/incremented erase signals of the present invention. Oscillating clocks Phi and $Phi_b$ are generated from block 305 and supplied to negative pumping circuit 310 to internally generate the required negative voltage $V_{NEG}$ that is used for the erase operation (NGCE) used in the present invention. After the negative voltage is generated on chip, it is distributed by a voltage switch control circuit 320 to appropriate sections of the Flash memory array as signal $V_{NGI}$. This signal, as well as a reference voltage $V_{REF}$ from voltage generator 350 is used by negative voltage level control (NVLVC) circuit 330 to generate the pre-erase conditioning signals described above in connection with step 120 (FIG. 2). Generally speaking, NVLVC circuit 330 divides the negative voltage $V_{NGI}$ into several smaller negative voltages, and these smaller voltages form the basis of the conditioning signals applied to the flash cells to effectively reduce the electrical field across the tunneling oxide. While the negative voltage is divided and distributed to needed sections in the Flash memory array, comparator circuit block 340 compares the internally generated voltage $V_{GER}$ to a pre-determined voltage reference to keep the internally pumped negative voltages at the right voltage level.

The aforementioned sections of pre-erase/incremented erase circuit 300 can be implemented in a variety of forms suitable for use with the present invention. For the present disclosure only portions of NVLVC circuit 330 need be explained in more descriptive detail, since it provides part of the novel and unique functionality and features of the present invention.

Figure 4A:
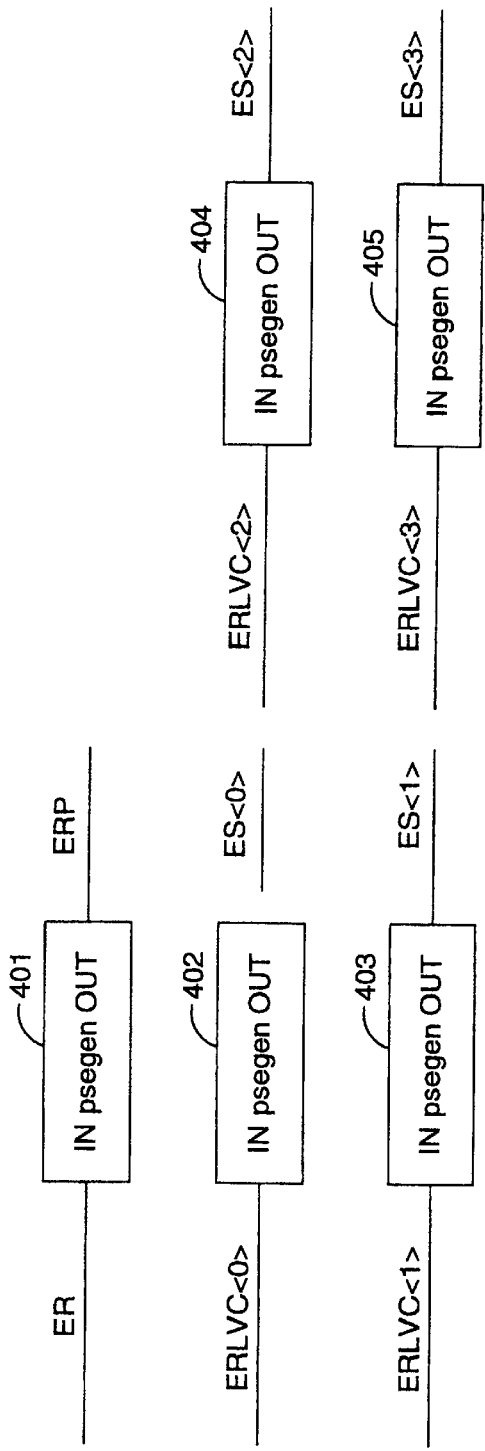
FIGS. 4A–4C are more detailed circuit schematics of aspects of a flash memory conditioning signal generating circuit relevant to the present invention.

As seen in FIG. 4A, a pre-erase/incremented erase signal generator circuit 450 generates output $V_{GER}$ used for reducing the tunnel oxide fields in response to a combination of various voltage reference and logic signals. First, a pre-erase/incremented erase voltage switch circuit 452 provides a negative input voltage $V_{NGI}$ in response to voltage $V_{NEG}$ from circuit 310, and as gated by signal ESTEPB. The latter is active in accordance with signal conditions which can be understood with reference to FIG. 4b. Output $V_{GER}$ can be seen as a divided version of negative voltage input $V_{NGI}$; in operation, a capacitor divider formed by capacitor 454, capacitor 460A, and other capacitor stages that are switched in (460B, 460C, 460D and 460E) depending on the state of certain logic variables ERLVC<3:0> which in turn activate associated FET switches (462B and 464B, 462C and 464C, 462D and 464D, and 462E and 464E respectively). For example, if a pre-erase conditioning pulse $V_{NGI}$ of approximate magnitude −6.25 volts is desired, only ERLVC <0> is activated; all other pre-erase magnitude control signals (ERLVC<1>, ERLVC<2>, ERLVC<3>) are low. These signals are generated in conventional fashion by a pre-erase/incremented erase magnitude control circuit, which is implemented as part of the logic controller circuit described above within the flash memory integrated circuit. Thus, with this combination, a negative voltage $V_{NGI}$ of approximately −6.25 volts is provided to pre-erase/incremented signal generator circuit 450, which voltage is then divided by the serial combination of capacitor 454 taken with the parallel combination of capacitor 460A and 460B. The latter is switched in by virtue of the fact that FET 462B is turned on by the state of ERLVC<0>, and the fact that FET 464B is switched off (by a signal ERLVCB <0>having opposite logic to ERLVC <0>). Furthermore, no other capacitor (460C, 460D or 460E) is switched in at this point. Accordingly, a capacitive divider is formed by 454, 460A and 460B between $V_{NGI}$ and ground, with $V_{GER}$ taken at a potential between capacitor 454 and capacitors 460A and 460B corresponding to approximately −6.25 volts. The other possible combinations of pre-erase/incremented erase magnitude control signals ERLVC<3:0> needed to generate larger magnitude pre-erase/incremented erase signals are given in the table of FIG. 4d. It is apparent, of course, that additional levels could be used if desired. While the pre-erase/incremented erase signals are being applied there is no contribution from $V_{REF}$, because FET 456 is not activated by signal ESTEP. Instead, $V_{REF}$ is used as a pre-charger for the capacitor divider, and is controlled by ESTEP generated by pre-erase/incremented erase voltage switch control circuit 406.

Figure 4B:
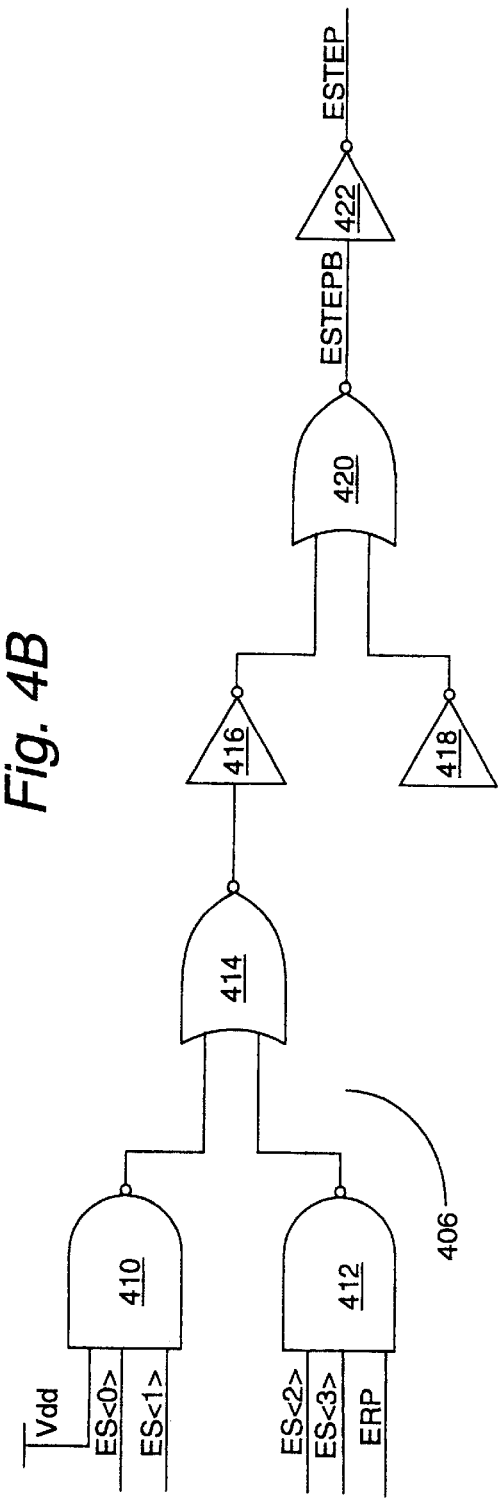
Figure 4C:
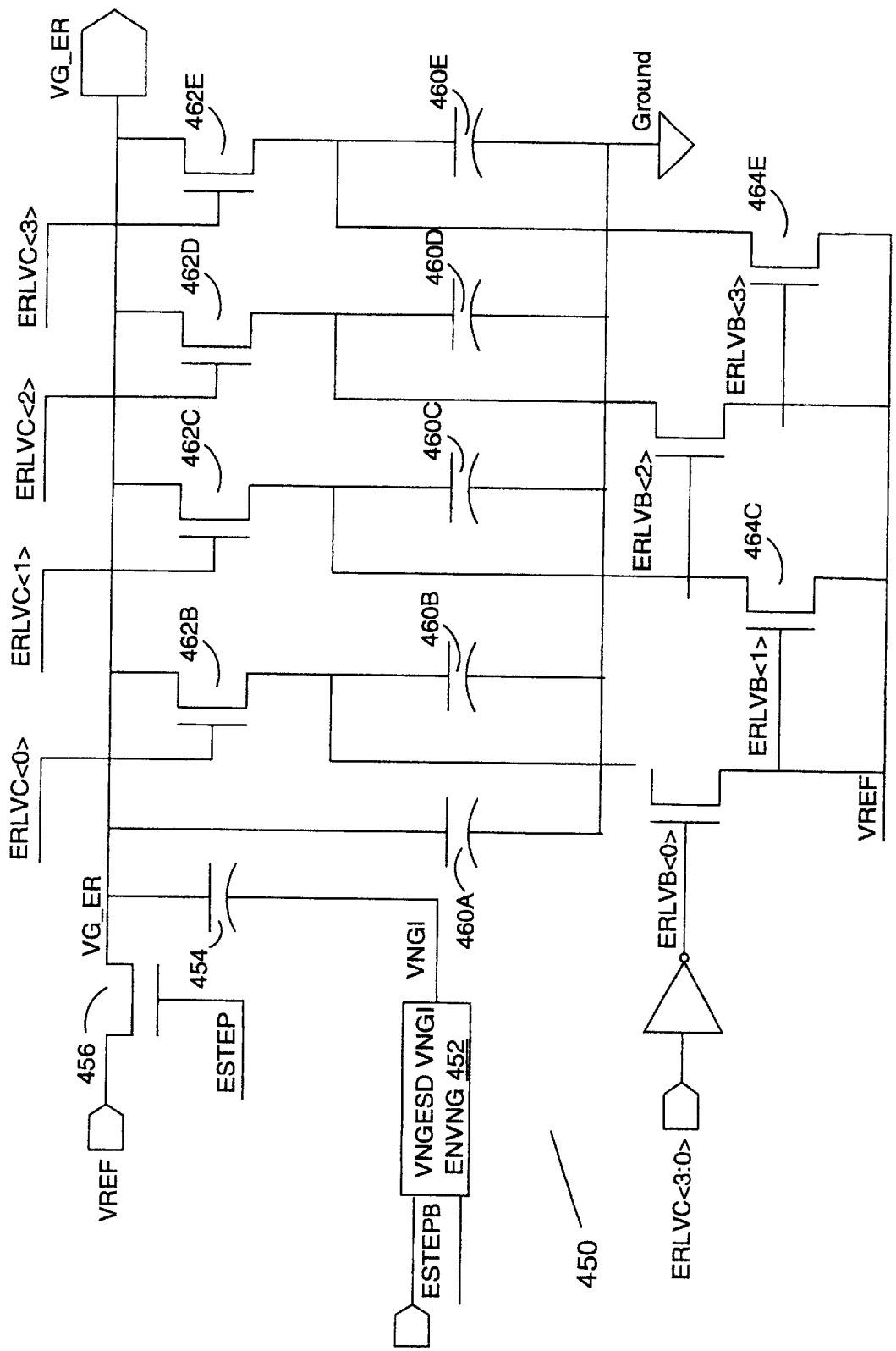
Figures 4D, 5:
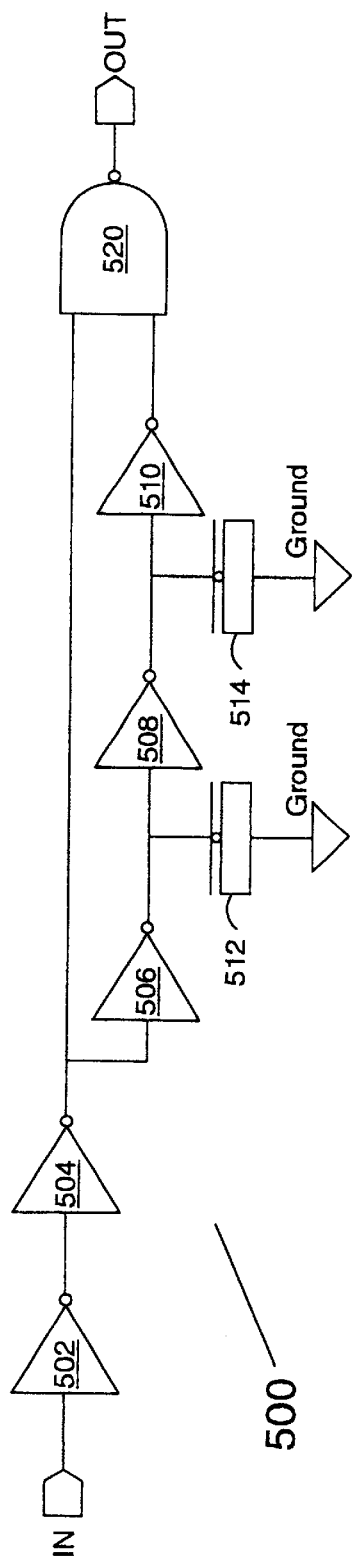
FIG. 4D is a table showing the sequence and magnitude of various conditioning signals generated by the present controller circuit.
FIG. 5 illustrates a first embodiment for generating a control pulse in response to the logic controller circuit using a one-shot delay circuit schematics comprised of a MOSFET device and capacitor elements.

The origin of signals ESTEP and ESTEPB are shown in FIGS. 4b and 4c. First, as seen in FIG. 4c, a series of pulse generators 401, 402, 403, 404 and 405 are provided. Inputs to these pulse generators are provided in the form of pre-erase/incremented erase magnitude control signals ERLVC<3:0>, and sequence control signal ER, which is also generated by the logic controller circuit to control the sequencing (time spacing) between consecutive pre-erase/incremented erase conditioning for the pre-erase/incremented erase state machine operations. These pulse generators govern the stages of the pre-erase/incremented erase signal $V_{NGI}$ and can be implemented and configured as described further below with reference to FIGS. 5 and 6.

Circuit 406 in FIG. 4b, therefore, can be considered as a pre-erase/incremented erase voltage switch control circuit for the pre-erase/incremented erase signal generating circuit 450. In the beginning, $V_{GER}$ is pre-charged to a reference voltage, which is a function of the ERLVC signals selected, and the effect of ESTEP in activating FET 456. Tis signal voltage $V_{GER}$ later on is coupled by a combination of various capacitors between $V_{NGI}$ and ground. This one-shot pre-charge of $V_{GER}$ is also supported by the operation of circuit 406.

As is apparent, the amount of charge removed from the floating gates of the memory cells is a function of the signal duration, and, their relative electrical field intensity across the tunnel oxide. Therefore, the $V_{NGI}$ control logic of FIG. 4a, and corresponding signal sequencing logic of FIG. 4c allows for additional tailoring of the characteristics of the pre-erase/incremented erase operation for any particular environment or application.

Figure 6:
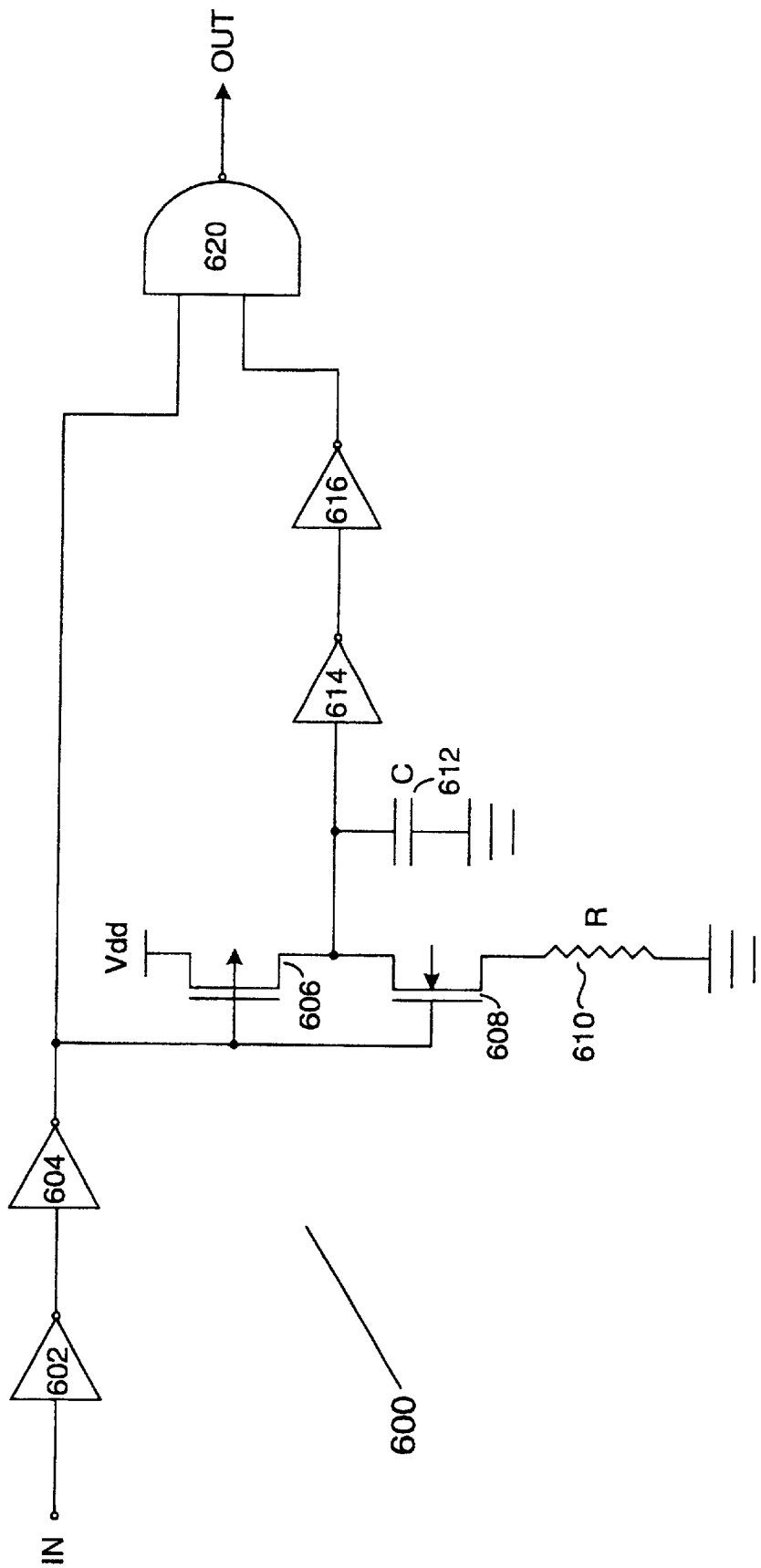
FIG. 6 illustrates a second embodiment for generating a control pulse for the logic controller using a one-shot delay circuit comprised of resistor and capacitor elements.

FIG. 5 illustrates a first embodiment of a single-shot pulse generator circuit 500 that can be used with the present invention. An input signal IN is provided to a first series of conventional inverters 502, 504 in a first signal path, while a second series of conventional inverters 506, 508 and 510 along with capacitive elements 512 and 514 are used in a second, delayed signal path. The OUT signal of NAND gate will track the IN signal in the manner illustrated in this figure, and the delay elements can be easily manufactured using conventional processing to reasonable accuracies needed to help control the pre-erase/incremented erase conditioning signal behavior. In FIG. 6, a second embodiment of a pulse generator circuit 600 is depicted. In this variation, input signal IN is provided to a first series of conventional inverters 602, 604 in a first signal path, while a second path is comprised of a variable delay inverter stage formed of PMOS FET 606, NMOS FET 608, and resistance R This stage is also followed by conventional inverters 614, 616, and a capacitive element 612. The OUT signal of NAND gate will track the IN signal in the manner illustrated in this figure, and the delay will be a function of the RC constant of the second signal path. The benefit of this embodiment lies in the fact that the delay characteristics can be customized on a chip by chip basis during the manufacturing process by conventional laser trimming operations performed on a variable resistor.

Figure 7C:
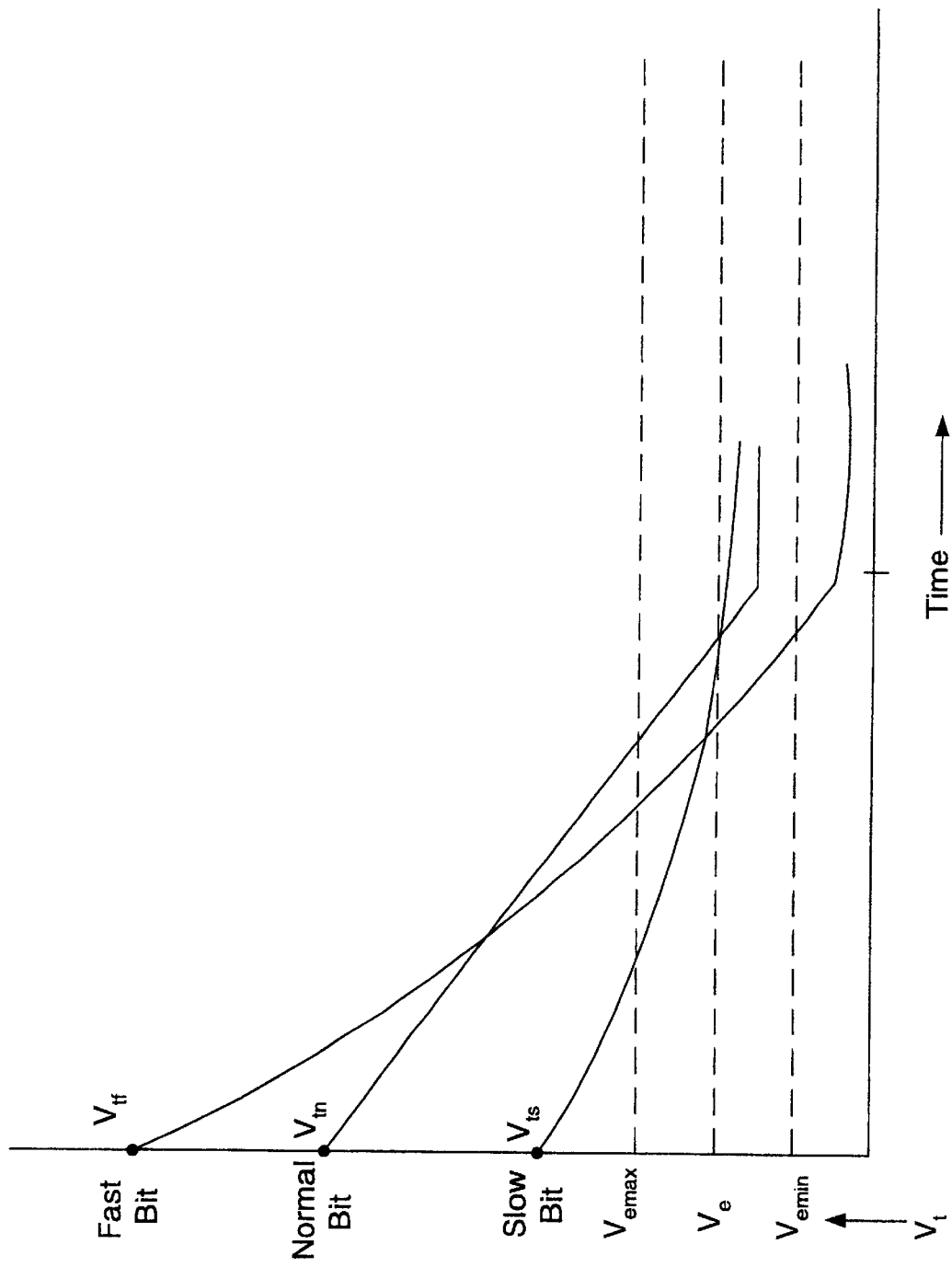
FIG. 7C is a graphical depiction of the effect of the pre-erase operation of the present invention on floating gate electrical charge discharge characteristics for flash cells in a memory array.

FIGS. 7A to 7C illustrate in rough graphical form the effect of the present invention on a typical flash memory cell array. It will be understood by those skilled in the art that these graphs are merely approximations and are not intended to reflect the actual behavior any particular array. Nevertheless, applicant believes that these illustrations help clarify the operational features, effects and benefits of the present inventions.

First, in FIG. 7A, voltage threshold distributions are plotted for a flash memory population in an erased state dower threshold voltage) and programmed state (higher threshold voltage). It should be noted first that these terms (erased, programmed) are merely descriptive labels for the charge condition of the floating gates, and it is entirely possible that in some applications these labels will be reversed for the same charge condition. In other words, the present invention can be practiced even in environments where the program/erase logic is opposite to that shown herein, since the operational features and benefits can still be employed effectively wherever it is desirable to equalize cell discharge rates. In any event, flash memory cells in a programmed state ideally have a voltage threshold $V_t=V_p$, where Vp is a target programmed voltage. In reality, however, the programmed threshold voltage distribution looks substantially like that shown in FIG. 7A, where there is an approximately normal distribution (solid line) centered around voltage level Vp. So long as the cells have threshold values between $V_{pmin}$ and $V_{pmax}$, nonetheless, they will still be adequately discriminated by the sense amplifiers of the flash device as being in a programmed state. Similarly, flash memory cells in an erased state ideally have a voltage threshold $V_t=V_e$, where $V_e$ is a target erased voltage. Again, in real world devices, chip designers are content to operate with the erased threshold voltage distribution looks substantially like that shown in the FIG. 7A, where there is an approximately normal distribution (solid line) centered around voltage level $V_e$. As above, so long as the cells have threshold values between $V_{emin}$ and $V_{emax}$, such cells will still be adequately discriminated by the sense amplifiers of the flash device as being in an erased state.

A serious problem, however, lies in the fact that the flash cells in the array do not behave consistently or uniformly during an erase operation. A slow bit, identified in FIG. 7a, will change threshold voltages at a rate far slower than a fast bit identified in FIG. 7a. These fast bits tend to become over-erased, and the slow bits tend to be under-erased, as evidenced by the dotted line distribution shown in FIG. 7a. For a variety of well-known reasons, the effect is not symmetric, however, so that the slight under-erasure of the slow bits does not usually present a significant problem. In other words, they are still discernible as "erased," so long as their threshold voltage is less than $V_{temax}$, and they do not contribute to any deleterious leakage currents as is the case with over-erased bits. In contrast, the fast bits can become over-erased, and therefore the population of cells within the shaded area of FIG. 7a must normally be dealt with using the corrective procedures described above. Still, this after-the-fact correction is undesirable and reduces device life span.

The benefits of the present invention on the cell threshold distribution can be seen in FIG. 7b. This shows the programmed state of the array, after the pre-erase operations have taken place. The top end of the voltage thresholds are curtailed, significantly, so that the distribution is tighter. The same fast bit has now had a threshold voltage alteration from $V_f$ to $V_f'$, where $V_f' < V_f$; this means that this same bit now acts more like an average cell, and is far less likely to be over-erased during the subsequent erase operation (shown approximately as the dotted line). The slow bits and average programmed bits, in contrast, are hardly affected, and therefore the overall erase operation is improved significantly from a variety of perspectives.

In FIG. 7C, a graphical comparison of cell discharge rates for fast, normal, and slow bits is given. Because of the intense electrical fields in fast bits, FN tunneling occurs much faster, so they discharge much faster compared to normal and slow bits as well. At the end of an erase operation (time $T_e$) such bits are well past being erased ($V_e$), and in fact are over-erased (below $V_{emin}$). By pushing the threshold voltage Vf to a more normal threshold voltage $V_N$ at the start of the erase operation, this bit now is more likely to behave like such normal bit, and therefore result in a correctly erased bit at the end of the erase operation.

Figure 8:
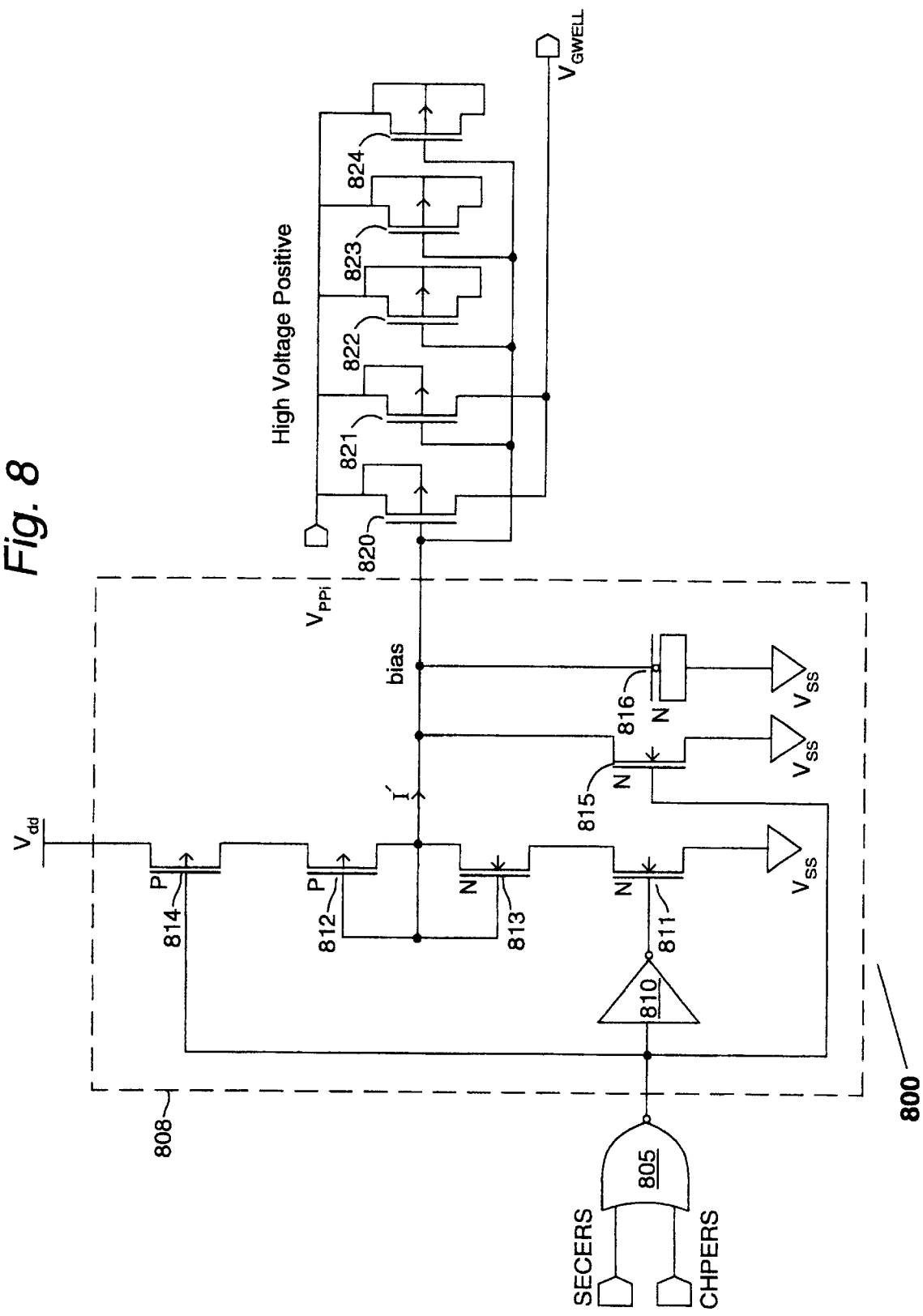
FIG. 8 depicts a preferred embodiment of a well bias voltage circuit used in the present invention.

FIG. 8 is an embodiment of a well bias voltage circuit 800 that is used in conjunction with the above pre-erase/incremented erase operations. This circuit is generally responsible for ramping the voltage state of the N-well and P-well regions of the array during these operations to facilitate the reduction of the field intensity across the tunnel oxides of the fast bits. To accomplish this, a voltage signal $V_{Gwell}$ is generated and applied by well bias voltage circuit at the same time the aforementioned $V_{GER}$ conditioning signal is applied to the control gates of the cells in the array. The characteristics of the well bias signal can be configured to the particular array in the following manner: first, the overall capacitance of the wells $C_L$ is generally known; to achieve a particular desired voltage change $\Delta V$ in the well in a particular time $\Delta T$, as shown in FIG. 8A, a constant current source I can be used, where $I = C_L * \Delta V/\Delta T$. Thus, given these parameters, a well bias voltage circuit 800 can be constructed in accordance with the circuit elements illustrated in FIG. 8. These include a select gate 805, which is triggered on either a sector erase (SECERS) or chip erase (CHPERS) signal. A bias level circuit 808 for generating a bias signal I' includes: a driver 810 coupled to a n type switch 811 to a first voltage terminal (Vss); the latter is in series with an inverter stage comprised of p type switch 812 and n type switch 813, and a p-type switch 814 connected through to a second voltage terminal (Vdd). A final n type switch 815, connected to Vss, and a capacitor 816 complete this portion of the well bias circuit A series of p-channel FETs 820, 821, 822, 823 and 824 receive bias signal I' and have a first terminal coupled to a high voltage positive pump signal VPPI generated in conventional fashion from a charge pump) from a source. Output VGwell is taken at a second terminal of these p-channel FETs. In a preferred embodiment, the number and selection of FETs 820–824 that contribute to this signal is configured during manufacture of the device based on measured/desired characteristics of such signal. Thus, in the example shown in FIG. 8, only two of the p-channel FETs (820 and 821) actually contribute to the $V_{Gwell}$ signal in this embodiment, but it is understood that any or all of such FETs (or a different number of FETs beyond that shown in this figure) can be configured by suitable processing selections (laser cutting for example) based on the particular requirements needed for signal $V_{Gwell}$. This circuit operates generally as follows: when an erase operation is selected, n type switch 815 is turned on, while p type switch 812 and n type switch are both turned off This pulls down the gate terminal (node) of p type FETs 820 and 821 to Vss (round), turning them on. This event in turn, couples the output terminals of such FETs to rise based on the terminal voltage $V_{PPI}$, and causing $V_{Gwell}$ to begin rising at a relatively constant rate based on the RC time constant resulting from capacitor 816 and the impedance of the two FETs. After a time T, therefore, $V_{Gwell}$ (and therefore the N and P wells) will attain a final value Vf, which, again, can be tailored for the specific array. This value of Vf, again, can be empirically determined based on testing and measurements of the array so that it contributes to optimize the effects of the aforementioned conditioning signals $V_{GER}$. In a preferred embodiment, applicants have discovered that a value of approximately—volts appears to work well as a well bias voltage signal level. As can be seen in FIG. 8, when there is no erase operation taking place, n type switch 815 is turned off, but n type switch 811 and p type switch 814 are turned on. This causes the gate terminal of p type FETs 820 and 821 to float, which means that such devices will not be turned on, and the $V_{Gwell}$ signal will float, and thus also be essentially isolated from the rest of the circuit 800. Other variations and implementation for this well bias voltage circuit will be apparent to those in the art from the above teachings, and the present invention is certainly not limited in any respect by any such particular adaptations. It will be immediately understood by those skilled in the art that a flash memory cell array integrated circuit can be manufactured using conventional processing means to include the teachings of the present invention. Such article of manufacture could include the inventive methods embodied as replacements for embedded algorithms in known control circuits, as well as usual combinations of flash memory cell arrays and conventional supporting peripheral circuitry (power supplies, address decoders, I/O data buffers, sense amplifiers, reference arrays, counters, timers, etc.). Such processing means and peripheral circuitry can be implemented using any of a number of structures and methods well-known in the art, and are therefore not described here in substantial detail.

It will also be appreciated by those skilled in the art that the above discussion is directed to a preferred embodiment of the present invention, and that the present teachings can be used in a number of different environments, applications, etc. For example, it is possible that other flash memory cell operations (other than erasures) may benefit from a conditioning operation that adjusts the electrical field across the tunnel oxide, or the amount of electrical charge on the floating gates. Similarly, while the present detailed description illustrates a mechanism for slowing down fast bits by removing charge, it is of course possible to also speed up slow bits by adding charge, and this feature, too, may be attractive for some applications. Accordingly, it is intended that the all such alterations and modifications be included within the scope and spirit of the invention as defined by the following claims.

What is claimed is:

1. A method of making a flash memory integrated circuit, said method including the steps of:
    (a) providing an array of flash memory cells in said integrated circuit, each of said cells having a conduction threshold voltage, a control gate, a floating gate, a source and a drain; and
    (b) providing a control circuit coupled to said array for adjusting the threshold voltages of the flash memory cells prior to an erase operation, the control circuit being configured such that:
        i) electrical charge on floating gates of the flash memory cells is modified by applying one or more partial erase signals having a magnitude and duration configured to affect substantially less electrical charge on said floating gates than that electrical charge required to place such flash memory cells into a fully erased state; and
        ii) the modification of said charge during step (i) can be repeated as desired to substantially equalize electrical field intensities across tunnel oxides associated with said floating gates of the flash memory cells;
        iii) one or more full strength erase signals, separate from said one or more partial erase signals, can be applied to such flash memory cells so as to place such cells in said fully erased state;
    wherein said one or more partial erase signals reduces cell over-erasures caused by said one or more separate full strength erase signals.

2. The method of claim 1, wherein said one or more partial erase signals are applied on a cell by cell basis, while said one or more separate full strength erase signals are applied globally to such cells in the array.

3. The method of claim 1, where a magnitude of said one or more partial erase signals is varied to remove more charge during each of said steps (i).

4. The method of claim 1, wherein erase discharge characteristics of such flash memory cells are made more uniform by said one or more partial erase signals.

5. The method of claim 1, wherein said one or more partial erase signals operate to counter non-uniformities in electrical field intensities across tunnel oxides for flash memory cells in such array.

6. The method of claim 1, wherein characteristics of said one or more partial erase signals can be adjusted while the flash memory cell integrated circuit is being manufactured to tailor such characteristics to the requirements of such cells in the flash memory.

7. The method of claim 1, wherein said one or more full strength erase signals consist of continuing extended applications of said one or more partial erase signals applied with an increasing magnitude during distinct steps of an incremented erase operation.

8. The method of claim 1, wherein said magnitude of said one or more partial erase signals is controlled by a state of a plurality of logic signals.

9. The method of claim 1, wherein said one or more partial erase signals are based on a negative voltage reference signal derived from a negative charge pump.

10. The method of claim 1, wherein a time sequencing of said one or more partial erase signals is controlled by a sequence control logic signal.

11. The method of claim 10, wherein said magnitude of said one or more partial erase signals is increased by a fixed amount during each time step (b) i) is repeated.

12. A method of making a flash memory integrated circuit, said method including the steps of:
    (a) providing an array of flash memory cells in said integrated circuit, each of said cells having a conduction threshold voltage, a control gate, a floating gate, a source and a drain; and
    (b) providing a control circuit coupled to said array for adjusting the threshold voltages of the flash memory cells, the control circuit being configured to execute both a pre-erase operation and an erase operation such that:
        i) said pre-erase operation employs Fowler-Nordheim (FN) tunneling to modify electrical charge on floating gates of the flash memory cells by one or more partial erase signals;
            wherein said one or more partial erase signals have a magnitude and duration adapted to affect substantially less electrical charge on said floating gates than that electrical charge required to place such flash memory cells into a fully erased state; and further wherein said one or more partial erase signals are repeated during steps of said pre-erase operation to substantially equalize electrical field intensities across tunnel oxides associated with said floating gates of the flash memory cells so as to reduce any over-erasures that could be caused by a later erase operation;

ii) said erase operation is executed after said pre-erase operation, and said erase operation employs one or more full strength erase signals, separate from said one or more partial erase signals used by said pre-erase operation;

wherein said which full strength erase signals have a magnitude and duration adapted to place such flash memory cells into said fully erased state.

13. The method of claim 12, wherein said pre-erase operation is effectuated in a number of separate steps and such that during each successive step, a magnitude of said one or more partial erase signals is increased.

14. The method of claim 13, wherein said pre-erase operation is extended so that said erase operation also is effectuated in a number of separate steps and such that during each successive step of said erase operation, a magnitude of said one or more full strength signals is increased until a final constant high level voltage is used for a final erase step.

15. The method of claim 12, wherein said pre-erase operation improves a distribution of conduction voltage thresholds of said flash memory cells after they are fully erased.

16. The method of claim 12, wherein during said pre-erase operation said one or more partial erase signals are adapted to be applied to said control gate of the flash memory cell, and said source and said drain are kept floating.

17. The method of claim 12, wherein said control circuit is further configured to apply a soft program pulse to any over-erased flash memory cells.

18. The method of claim 17, wherein said control circuit is further configured to apply a soft erase pulse to any of said flash memory cells that are not placed in said fully erased state.

19. The method of claim 12, wherein said erase operation also uses FN tunneling.

20. The method of claim 12, further including a step (c): providing a well bias circuit adapted for ramping a voltage value within a well in which said array of flash memory cells are located.

* * * * *